US007339265B2

(12) United States Patent
Kitao et al.

(10) Patent No.: US 7,339,265 B2
(45) Date of Patent: Mar. 4, 2008

(54) CAPACITANCE TYPE SEMICONDUCTOR SENSOR

(75) Inventors: Norio Kitao, Shinshiro (JP); Akinobu Umemura, Nagoya (JP)

(73) Assignee: DENSO CORPORATION, Kariya (JP)

( * ) Notice: Subject to any disclaimer, the term of this patent is extended or adjusted under 35 U.S.C. 154(b) by 3 days.

(21) Appl. No.: 11/178,303

(22) Filed: Jul. 12, 2005

(65) Prior Publication Data
US 2006/0049506 A1 Mar. 9, 2006

(30) Foreign Application Priority Data
Sep. 8, 2004 (JP) .............................. 2004-260742

(51) Int. Cl.
*H01L 23/48* (2006.01)
*H01L 23/52* (2006.01)
(52) U.S. Cl. ................ 257/690; 257/784; 257/E23.141
(58) Field of Classification Search ................ 438/16, 438/17, 25, 26, 109, 118; 257/690, 784, 257/E23.141
See application file for complete search history.

(56) References Cited
U.S. PATENT DOCUMENTS
5,864,062 A * 1/1999 Nagahara et al. ........ 73/514.01

6,803,254 B2 * 10/2004 Park et al. ................... 438/109
6,810,736 B2 * 11/2004 Ikezawa et al. ............... 73/493
6,848,306 B2 * 2/2005 Kunda ...................... 73/514.01
2002/0064905 A1 * 5/2002 Park et al. ................... 438/109
2003/0177831 A1 * 9/2003 Ikezawa et al. ........... 73/514.16

FOREIGN PATENT DOCUMENTS
| JP | 2000-227439 | 8/2000 |
| JP | A-2003-57038 | 2/2003 |
| JP | A-2004-294071 | 10/2004 |

* cited by examiner

*Primary Examiner*—Michelle Estrada
(74) *Attorney, Agent, or Firm*—Posz Law Group, PLC

(57) ABSTRACT

In a capacitance type semiconductor dynamic quantity sensor, a sensor chip and a circuit are connected to each other through adhesive film having an elasticity of 200 MPa or less to reduce the temperature characteristic. Four bonding wires for connecting the sensor chip and the circuit chip are arranged so that each of the bonding wires is located at the center portion of each side portion of the sensor chip or at each corner portion of the sensor chip, thereby sufficiently increasing the interval between the bonding wires and thus sufficiently reducing the absolute value of the parasitic capacitance thus occurring. Therefore, even when the parasitic capacitance between the four bonding wires is varied, the variation is very small, and thus the influence on the sensor characteristic can be reduced.

8 Claims, 5 Drawing Sheets

CAPACITANCE TYPE SEMICONDUCTOR SENSOR

CROSS REFERENCE TO RELATED APPLICATION

This application is based upon, claims the benefit of priority of, and incorporates by reference the contents of, Japanese Patent Application No. 2004-260742 filed on Sep. 8, 2004.

FIELD OF THE INVENTION

The present invention relates to a capacitance type semiconductor sensor for detecting a dynamic quantity of an acceleration sensor, a gyro sensor or the like as a variation of electrostatic capacitance.

BACKGROUND OF THE INVENTION

A device having a stack structure in which semiconductor chips are stacked as shown in FIGS. 7 and 8 (for example, see JP-A-2000-227439) is known as one of the capacitance type semiconductor sensors as described above, for example, as a semiconductor acceleration sensor for an air bag of a vehicle, for example. According to this device, a sensor chip 1 having an acceleration detector is adhesively mounted on a circuit chip 2 having a signal processing circuit and further the circuit chip 2 is adhesively secured in a package 3 formed of a ceramic substrate as shown in FIG. 8.

Furthermore, for example, four electrode pads formed at one side portion of the sensor chip 1 and electrode pads of the circuit chip 2 which are formed in connection with the four electrode pads of the sensor chip 1 are electrically connected to one another by bonding wires as shown in FIG. 7. Furthermore, the circuit chip 2 and the electrode leads 3a of the package 3 are also electrically connected to one another by bonding wires 5 (shown in FIG. 8).

The semiconductor acceleration sensor is fixed onto a print board by mounting the package 3 formed of the ceramic substrate on the print board. However, when deformation occurs in the print board, for example, deformation due to expansion/contraction caused by the surrounding temperature or deformation caused by an external impact or the like occurs in the print board, the stress corresponding to the deformation is transmitted to the package 3, and further transmitted to the circuit chip 2 or the sensor chip 1 adhering to the package 3. Such a stress breaks the adhesion between the circuit chip 2 and the sensor chip 1, causes breaking of the bonding wires 5, etc., and thus it is not favorable.

In view of the foregoing problem, the adhesion between the sensor chip 1 and the circuit 2 is carried out through elastic adhesion film 6 as shown in FIG. 8 so that no stress is transmitted from the circuit chip 2 to the sensor chip 1.

However, in the case of use of the elastic adhesive film 6, when vibration is transmitted from the external, it is confirmed that the sensor chip 1 on the adhesive film 6 resonates between the circuit chip 2 and the sensor chip 1. In such a case, the following problem occurs.

FIG. 9 shows a part of the sensor circuit formed on the sensor chip 1 and the circuit chip 2.

Capacitance 1a is formed of a movable electrode and a fixed electrode in the sensor chip 1, and the sensor chip 1 is provided with four electrode pads 1b. The four electrodes 1b comprise two input terminals, one output terminal and a ground terminal.

The circuit chip 2 is also provided with four electrode pads 2a, and the four electrode pads 2a comprise two output terminals, one input terminal and a ground terminal. The circuit chip 2 is provided with two carrier wave generators 2b for outputting carrier waves from the output terminals, and a conversion circuit 2c for converting a signal input from the input terminal to a voltage signal.

In the construction as described above, carrier waves which are voltages having opposite phases to each other are output from the two carrier wave generators 2b provided to the circuit chip 2 through the output terminals, whereby each carrier wave is input through the input terminal of the sensor chip 1 and the corresponding voltage is applied to the capacitance 1a.

When an acceleration is applied and the movable electrode is displaced, the capacitance 1a is varied, and thus the signal corresponding to the variation of the capacitance 1a is output from the output terminal of the sensor chip 1. This signal corresponds to an acceleration detection signal, and it is input through the input terminal of the circuit chip 2 to the voltage conversion circuit 2c to be converted to a voltage signal in the voltage conversion circuit 2c.

The acceleration detection is carried out by the acceleration sensor as described above. Therefore, the acceleration detection signal output from the output terminal of the sensor chip 1 is required to be accurately input to the input terminal of the circuit chip 2.

However, in the above conventional construction, the interval between the bonding wires 4 for electrically connecting the sensor chip 1 and the circuit chip 2 is relatively narrow, and thus the parasitic capacitance 7 occurring between the neighboring wires 4 is relatively large.

Therefore, the acceleration detection signal output from the output terminal of the sensor chip 1 is varied by the effect of the parasitic capacitance 7, and the sensor falls into a state where the acceleration detection signal is inaccurately input to the input terminal of the circuit chip 2. When the interval between the bonding wires 4 is varied by the resonance of the sensor chip 1 and the parasitic capacitance 7 is varied, the variation of the acceleration detection signal output from the output terminal of the sensor chip 1 by the effect of the parasitic capacitance 7 is also varied. Therefore, even when the zero-point of the output voltage (hereinafter referred to as "0-point output voltage) is determined with the acceleration detection signal of the sensor chip 1 for the acceleration of 0 as a standard, the 0-point output voltage is varied due to the variation of the interval between the bonding wires 4, and the accurate acceleration detection cannot be performed.

SUMMARY OF THE INVENTION

The present invention has been implemented in view of the foregoing situation, and has an object to prevent an adverse effect of parasitic capacitance occurring between bonding wires for electrically connecting a sensor chip and a circuit chip in a capacitance type semiconductor sensor having a stack structure in which the sensor chip is mounted on the circuit chip through adhesive film, thereby enhancing the characteristic of the capacitance type semiconductor sensor.

In order to attain the above object, according to a first aspect, a capacitance type semiconductor sensor device having a stack structure in which a sensor chip is mounted on a circuit chip through adhesive film, is characterized in that the adhesive film has an elasticity of 200 MPa or less, and plural bonding wires for electrically connecting the sensor chip and the circuit chip are arranged so as to be dispersed at plural side portions or corner portions of the sensor chip.

As described above, by using a material having the elasticity of 200 MPa or less as the adhesive film, the temperature characteristic of the acceleration sensor 11 can be set to almost zero.

Furthermore, the plural bonding wires are not provided so as to be concentrated on one side portion of the sensor chip, but arranged dispersively, so that the interval between the bonding wires is increased and thus the absolute value of parasitic capacitance occurring can be reduced. Accordingly, even when the bonding wires are deformed and the parasitic capacitance between the bonding wires is varied, the variation can be suppressed to an extremely small value, and thus the effect on the sensor characteristic (detection precision) can be reduced. As a result, according to the first aspect, the adverse effect of the parasitic capacitance occurring between the bonding wires can be prevented, and the characteristic can be enhanced.

In this case, in the construction that the sensor chip and the circuit chip are electrically connected to each other by four bonding wires, according to a second aspect, each of the four bonding wires are arranged at the center portion of each side portion of the sensor chip, or according to a third aspect, each of the four bonding wires are arranged at each corner portion of the sensor chip.

Accordingly, the interval between the four bonding wires can be sufficiently increased, and the absolute value of the parasitic capacitance can be sufficiently reduced. In addition, the adverse effect of the parasitic capacitance can be excellently prevented. In this case, the four bonding wires are kept to be pitched in four directions, and thus the sensor chip can achieve an excellently balanced holding force to the circuit chip by the bonding wires, so that an effect of enhancing the resistance to shock (preventing resonance) can be expected.

The circuit chip is mounted on the board, and electrically connected by the plural bonding wires. In this case, according to a fourth aspect, each of four bonding wires of these bonding wires may be arranged at each corner portion of the circuit chip. According to the fourth aspect, the circuit chip can achieve an excellently balanced holding force to the board by the bonding wires pitched in the four directions, so that the resonance of the circuit chip to the board can be prevented, and furthermore the effect of suppressing the shock to the sensor chip can be expected.

BRIEF DESCRIPTION OF THE DRAWINGS

The above and other objects, features and advantages of the present invention will become more apparent from the following detailed description made with reference to the accompanying drawings.

DETAILED DESCRIPTION OF THE PREFERRED EMBODIMENTS

Preferred embodiments according to the present invention will be described hereunder with reference to the accompanying drawings. In the following embodiments, the same or equivalent parts are represented by the same reference embodiments.

First Embodiment

Figure 1:
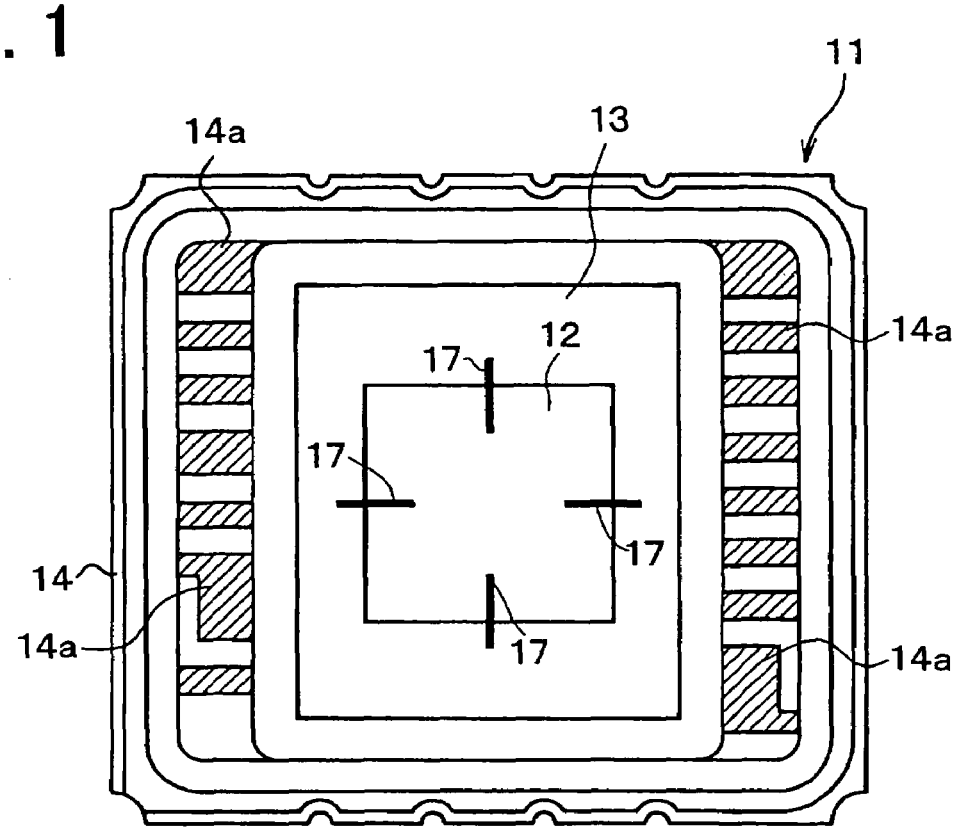
FIG. 1 is a plan view showing an acceleration sensor according to a first embodiment.
Figure 2:
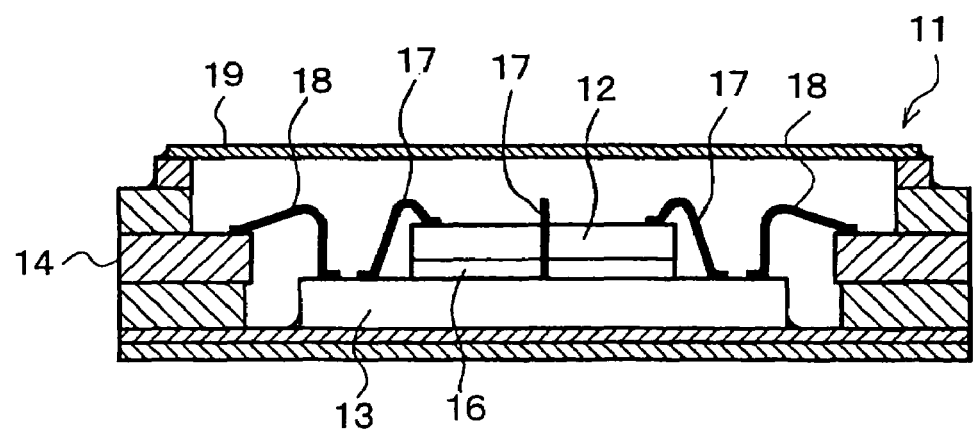
FIG. 2 is a longitudinally-sectional view showing the acceleration sensor shown in FIG. 1.
Figure 3:
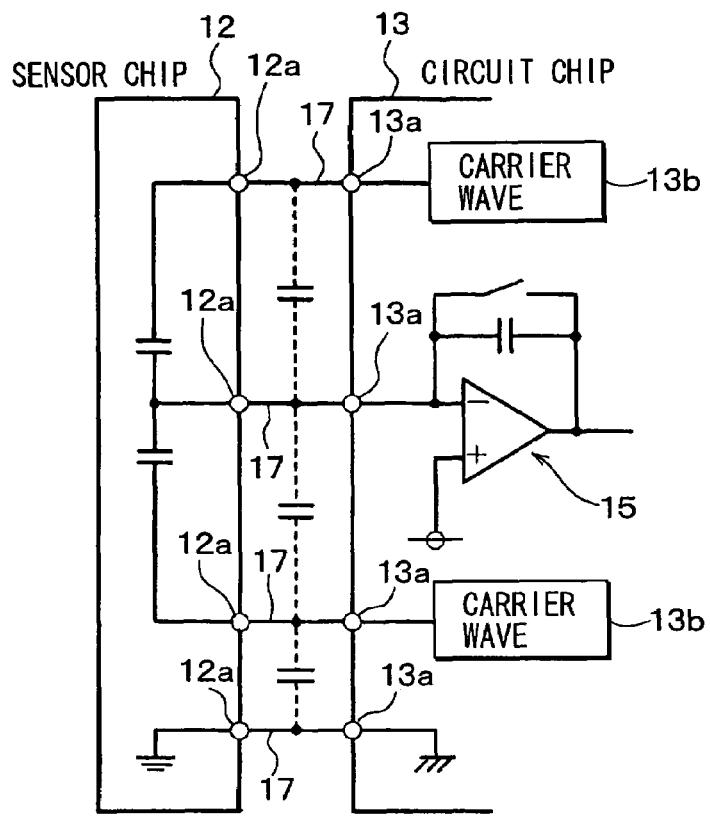
FIG. 3 is a diagram showing the circuit construction of a sensor circuit formed on a sensor chip and a circuit chip shown in FIG. 1.

FIG. 1 is a schematic plan view showing the overall construction of an acceleration sensor as a capacitance type semiconductor sensor to which an embodiment of the present invention is applied. FIG. 2 is a longitudinally-sectional front view showing the semiconductor acceleration sensor as shown in FIG. 1, and FIG. 3 shows a part of a sensor circuit provided to the acceleration sensor. The acceleration sensor according to this embodiment will be described hereunder with reference to the drawings.

As shown in FIGS. 1 and 2, the acceleration sensor 11 of this embodiment is designed to have a stack structure in which a sensor chip 12 is mounted on a circuit chip 13, and the sensor chip 12 and the circuit chip 13 thus stacked is accommodated in a package 14 as a board. Not illustrated specifically, the sensor chip 12 is designed to be located at the center portion on the surface of a semiconductor (silicon) substrate and form an acceleration detector as a dynamic quantity detector by the micro-machining technique. As well known, the acceleration detector is designed so that so-called comb-shaped fixed electrode and movable electrode are arranged so as to confront each other through a gap formed therebetween, and it detects an acceleration as variation of the electrostatic capacitance between the fixed electrode and the movable electrode.

Four electrode pads (terminals) 12a for electrically connecting the sensor chip 12 and the circuit chip 13 are formed on the surface portion of the sensor chip 12 (the upper surface in FIG. 2). As shown in FIG. 3, the four electrode pads 12a comprise two input terminals, one output terminal and a ground terminal. In this embodiment, each of the four electrode-pads 12a is provided so as to be located at the center portion of each side portion of the sensor chip 12.

The circuit chip 13 is designed in a rectangular shape larger than the sensor chip 12 so as to have a signal processing circuit for processing a signal from the sensor chip 12. The center portion of the surface of the circuit chip 13 is set as a chip-mount area on which the sensor chip 12 is mounted, and four electrode pads (terminals) 13a are formed out of the chip-mount area in connection with the four electrode pads 12a of the sensor chip 12.

As shown in FIG. 3, the four electrode pads 13a comprise two output terminals, one input terminal and a ground terminal. The circuit chip 13 outputs pulse-shaped carrier waves having opposite phases from carrier wave generators 13b through the two output terminals 13a. Furthermore, the circuit chip 13 is provided with a conversion circuit 15 for converting an acceleration signal input from the input terminal 13a to a voltage signal. Not illustrated specifically, plural electrode pads for connecting the circuit chip 13 to the package 14 are formed at each of both the right and left side portions on the surface of the circuit chip 13.

The package 14 is formed of a ceramic board, for example, and designed in the form of a thin rectangular case. The center portion of the package 14 is set as an area in which the circuit chip 13 is mounted. Plural electrode leads 14a (hatched for the same of convenience) are provided along the right and left side portions of the package 14 in connection with the electrode pads of the circuit chip 13, and also terminals for external connection (not shown) are provided so as to be located at the outer surface portion.

As shown in FIG. 2, the sensor chip 12 is adhesively mounted on the circuit chip 13 by adhesive film 16. The adhesive film 16 has low elasticity, and it is designed to be relatively thick and absorb stress so that no external stress occurring due to temperature variation or the like is transmitted to the sensor chip 12.

Specifically, when the thickness of the adhesive film 16 is set to 175 microns, the elasticity of the adhesive film 16 is set to 200 MPa or less. When the elasticity of the adhesive film 16 is excessively high, it has been confirmed that the environment under which the acceleration sensor 11 is used is varied from the room temperature, the elastic film 16 cannot absorb the stress due to the temperature variation and thus the 0-point output voltage is varied.

Figure 4:
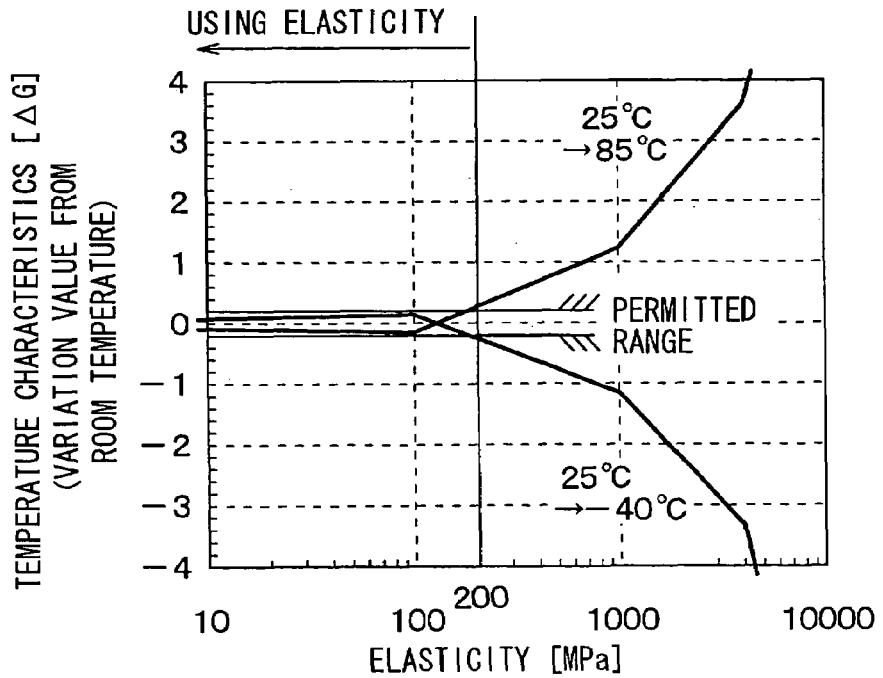
FIG. 4 is a diagram showing an experimental test result of the temperature characteristic of the acceleration sensor which is caused by variation of the elasticity (MPa) of adhesive film.

FIG. 4 is an experimental test result of the temperature characteristic of the acceleration sensor 11 due to the variation of elasticity (MPa) when the thickness of the adhesive film 16 is set to 175 microns. This experiment investigated the variation values (ΔG) of the 0-point output voltage of the acceleration sensor 11 when the temperature of the use environment of the acceleration sensor 11 was varied from 25° C. to 85° C. and when the temperature of the use environment of the acceleration sensor 11 was varied from 25° C. to −40° C.

As is shown in FIG. 4, when the elasticity of the adhesive film 16 is reduced to 200 MPa or less, the temperature characteristic of the acceleration sensor 11 is substantially equal to zero. However, when the elasticity of the adhesive film 16 exceeds 200 MPa, the temperature characteristic increases as the elasticity is larger. Therefore, in this embodiment, the elasticity of the adhesive film 16 is set so that it is not more than 200 MPa.

Furthermore, the circuit chip 13 adheres to the package 14 by adhesive agent, for example, whereby the sensor chip 12 and the circuit chip 13 are fixed to the package 14.

The respective electrode pads 12a of the sensor chip 12 and the respective electrode pads 13a of the circuit chip 13 are electrically connected to one another by four bonding wires 17 for the sensor chip. As shown in FIG. 1, each of the four bonding wires 17 is disposed at the center portion of each side portion of the sensor chip 12 so that they extend in a radial direction (makes a cross-shape) in four directions. The electrode pads at both the right and left side portions of the circuit chip 13 and the electrode leads 14a of the package 14 are electrically connected to one another by plural bonding wires 18 for the circuit chip (see FIG. 2). The opening portion of the upper surface of the package 14 is air-tightly closed by a lid 19 (see FIG. 2).

Next, the action of the acceleration sensor 11 thus constructed will be described.

In the above construction, parasitic capacitance occurs between the bonding wires 17 for connecting the sensor chip 12 and the circuit chip 13 as shown in FIG. 3. When the bonding wires 17 are deformed by an application of an impact from the external (for example, resonance of the sensor chip 12 to the circuit chip 13), there is a risk that some variation occurs in the parasitic capacitance and thus the characteristic (the 0-point output voltage) varies.

According to this embodiment, however, the four bonding wires 17 for connecting the sensor chip 12 and the circuit chip 13 are arranged so that each of the bonding wires 17 is located at the center portion of each side portion of the sensor chip 12, so that the interval between the bonding wires 17 can be more sufficiently increased as compared with the conventional acceleration sensor in which all the bonding wires 4 are arranged at one side portion of the sensor chip 1, and thus the absolute value of the parasitic capacitance occurring can be sufficiently reduced.

Therefore, even when the parasitic capacitance between the four bonding wires 17 is varied due to occurrence of the resonance of the sensor chip 12 on the basis of vibration from the external, the variation concerned is very small and thus the influence on the sensor characteristic (detection precision) can be reduced.

As described above, according to this embodiment, there can be achieved an excellent effect that the adverse effect of the parasitic capacitance occurring between the bonding wires 17 for electrically connecting the sensor chip 12 and the circuit chip 13 can be prevented in the acceleration sensor having the stack structure that the sensor chip 12 is mounted on the circuit chip 13, and thus the characteristic can be enhanced.

In this embodiment, the four bonding wires 17 are kept to be pitched in the four directions, so that the excellently balanced holding force of the sensor chip 12 to the circuit chip 13 can be achieved by the bonding wires 17, and thus there can be also expected the effect that the resistance to the shock can be enhanced (the resonance can be prevented).

Second Embodiment

Figure 5:
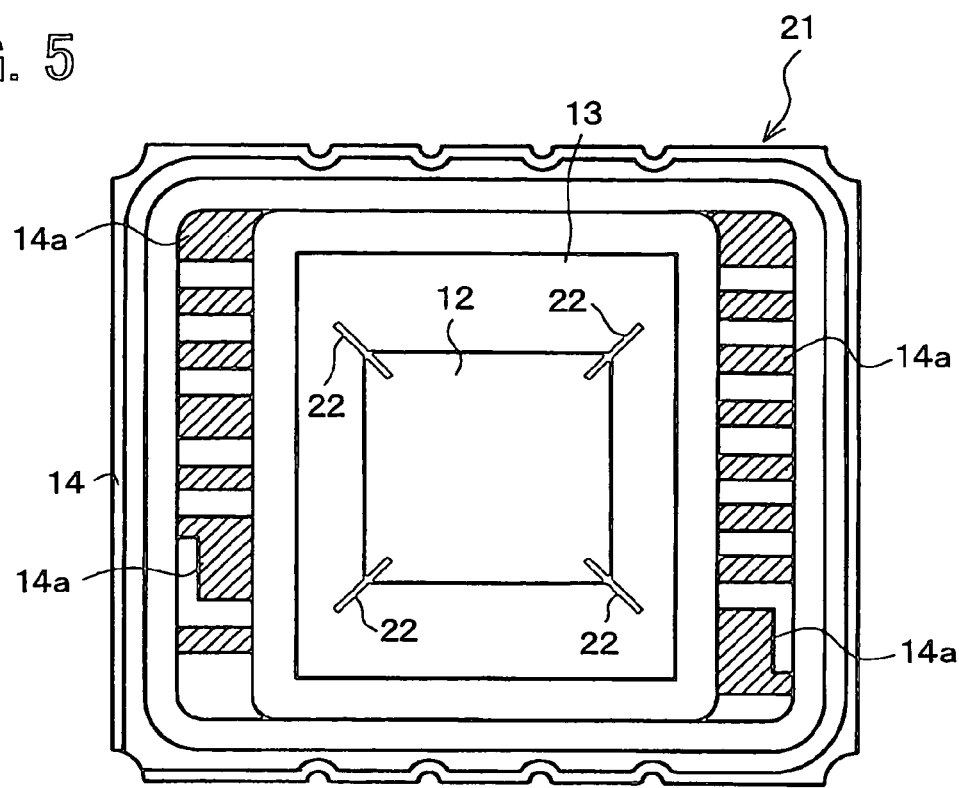
FIG. 5 is a plan view showing an acceleration sensor according to a second embodiment.

FIG. 5 shows the construction of an acceleration sensor 21 according to a second embodiment. The second embodiment is different from the first embodiment in that the four bonding wires 22 for connecting the sensor chip 12 and the circuit chip 13 are arranged so that each of the bonding wires is disposed at each of the four corner portions of the sensor chip 12.

With this construction, the interval between the four bonding wires 22 can be sufficiently increased as in the case of the first embodiment, and the absolute value of the parasitic capacitance can be sufficiently reduced. Furthermore, there can be achieved an excellent effect of preventing the adverse effect caused by the parasitic capacitance, and the characteristic can be enhanced. In addition, the four bonding wires 22 are set to be pitched in the four directions, and thus there can be achieved an effect that the excellently balanced holding force of the sensor chip 12 to the circuit chip 13 can be achieved by the bonding wires 22 and the resistance to the shock can be enhanced (the resonance can be prevented).

Third Embodiment

Figure 6:
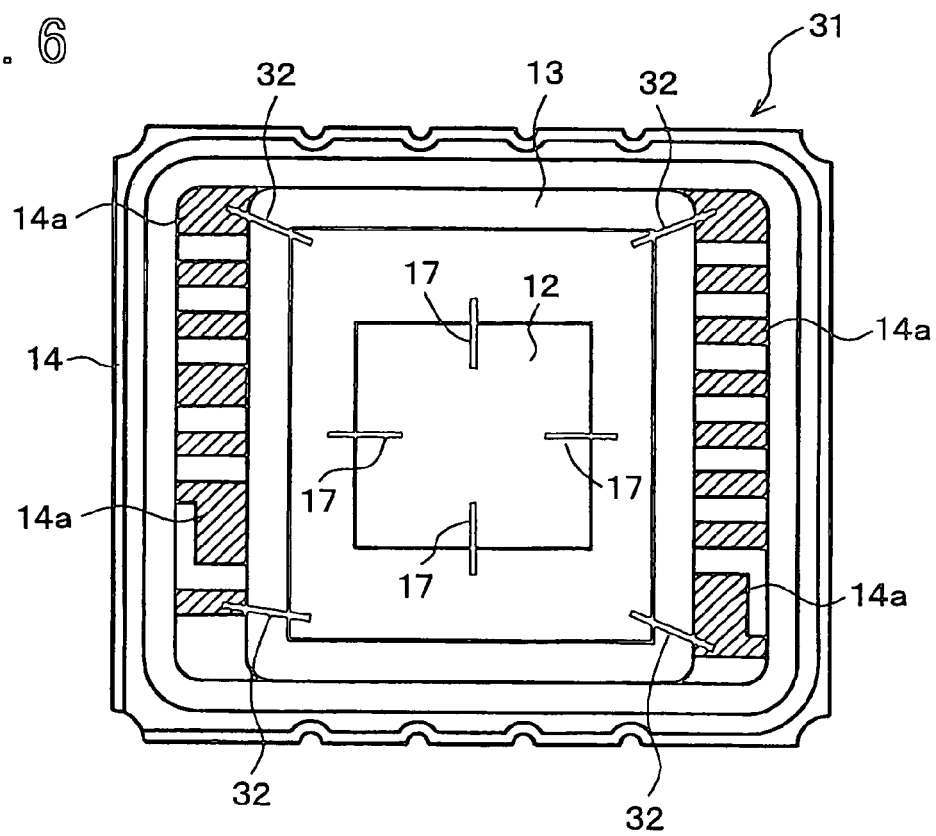
FIG. 6 is a plan view showing an acceleration sensor according to a third embodiment.
Figure 7:
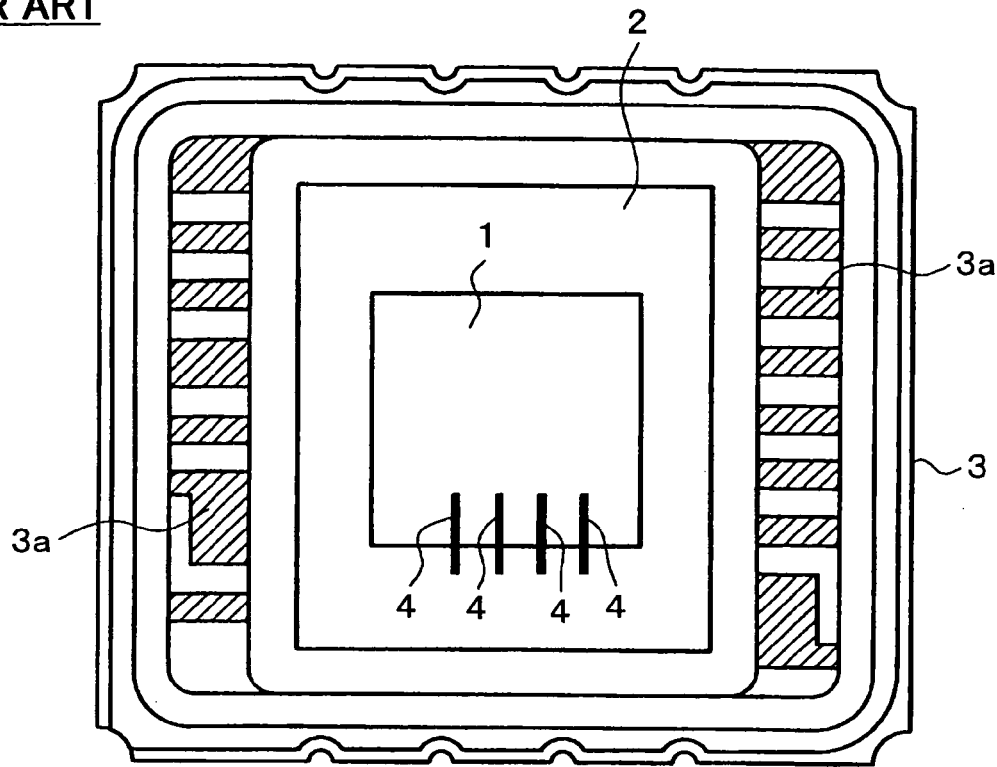
FIG. 7 is a plan view showing a conventional acceleration sensor.
Figure 8:
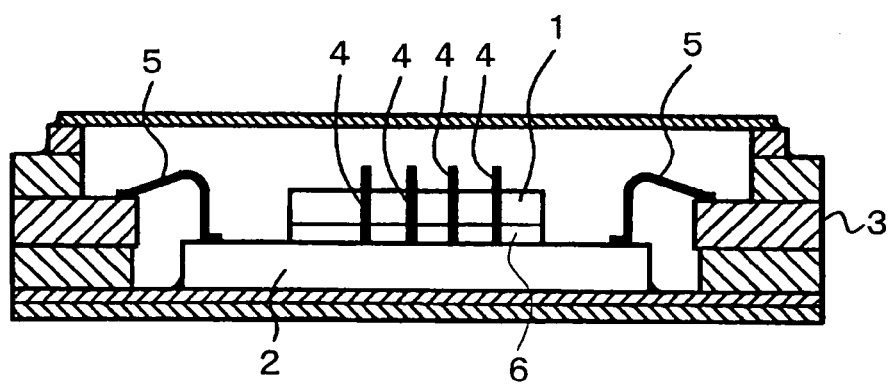
FIG. 8 is a longitudinally-sectional front view of the acceleration sensor shown in FIG. 7.
Figure 9:
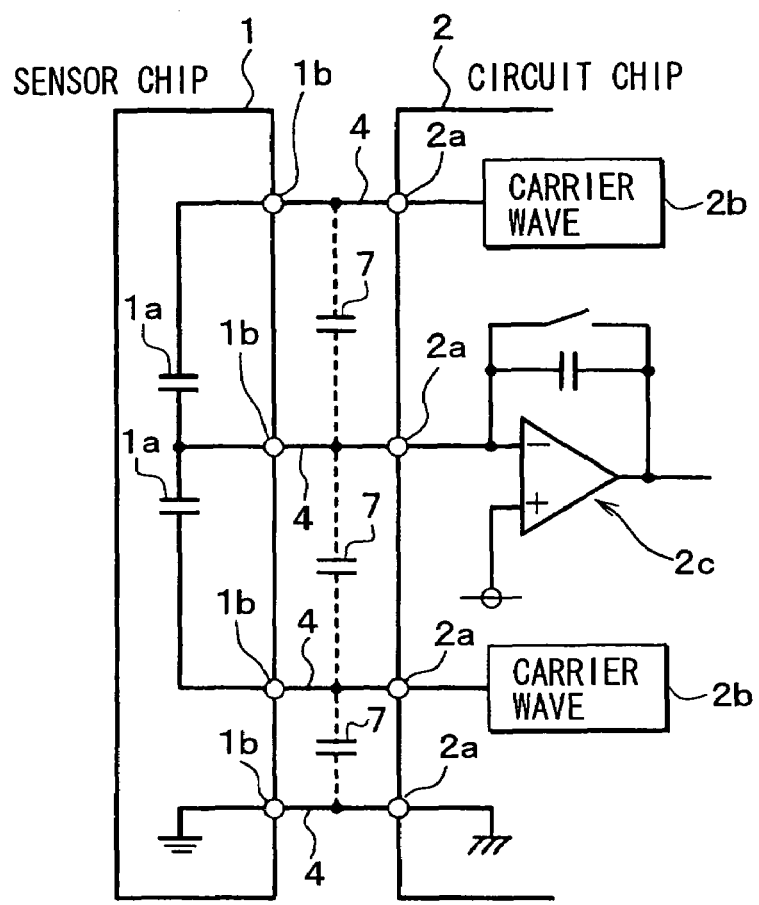
FIG. 9 is a diagram showing the circuit construction of a sensor circuit formed on a sensor chip and a circuit chip shown in FIG. 7.

FIG. 6 shows the construction of an acceleration sensor 31 according to a third embodiment. In the third embodiment, the four bonding wires 17 for connecting the sensor chip 12 and the circuit chip 13 are arranged so that each bonding wire 17 is located at the center portion of each side portion of the sensor chip 12 as in the case of the first embodiment, and in addition, (substrate) bonding wires 32 for electrically connecting the circuit chip 13 and the package 14 are arranged so that each of four bonding wires 32 thereof is located at each corner portion of the circuit chip 13.

According to this embodiment, the same effect as the first embodiment can be achieved, and also the excellently balanced holding force-of the circuit chip 13 to the package 14 can be achieved by the substrate bonding wires 32 which are kept to be pitched in the four directions, and consequently it is expected that the resonance of the circuit chip 13 to the package 14 can be prevented, and further the shock to the sensor chip 12 can be suppressed.

Other Embodiments

In the above embodiments, the sensor chip 12 and the circuit chip 13 are connected to each other by the four bonding wires 17. However, even when they are connected by three or five or more bonding wires, plural bonding wires are dispersively arranged at plural side portions or corner portions of the sensor chip, whereby the above object can be achieved. Furthermore, in the above embodiments, the present invention is applied to the acceleration sensor. However, the present invention can also be applied to other capacitance type semiconductor sensor devices such as a gyro sensor, etc.

The present invention is not limited to the respective embodiments described above and illustrated in the drawings, and various modifications may be suitably made without departing from the subject matter of the present invention.

What is claimed is:

1. A capacitance type semiconductor sensor device having a stack structure in which a sensor chip having a dynamic quantity detector is mounted on a circuit chip having a signal processing circuit through adhesive film, the sensor chip and the circuit chip being electrically connected to each other by plural bonding wires, characterized in that the adhesive film has an elasticity of 200 MPa or less, and the plural bonding wires are arranged dispersively at plural side portions or corner portions of the sensor chip, wherein the number of the plural bonding wires for connecting the sensor chip and the circuit chip is equal to four, and the bonding wires are arranged so that each of the bonding wires is located at each corner portion of the sensor chip, wherein the circuit chip includes four or more circuit chip electrode terminals disposed outside of a chip-mount area in which the sensor chip is mounted on the circuit chip, the four or more circuit chip electrode terminals for electrically connecting the circuit chip to the sensor chip, wherein the four or more circuit chip electrode terminals include two output terminals for outputting pulse-shaped carrier waves having opposite phases, one input terminal for receiving an acceleration signal, and a ground terminal, wherein the circuit chip includes a conversion circuit for converting the acceleration signal to a voltage signal.

2. A capacitance type semiconductor sensor device having a stack structure in which a sensor chip having a dynamic quantity detector is mounted on a circuit chip having a signal processing circuit through adhesive film, the sensor chip and the circuit chip being electrically connected to each other by plural bonding wires, characterized in that the adhesive film has an elasticity of 200 MPa or less, and the plural bonding wires are arranged dispersively at plural side portions or corner portions of the sensor chip,
  wherein the number of the plural bonding wires for connecting the sensor chip and the circuit chip is equal to four or more than four, and four of the bonding wires are arranged so that each of the four bonding wires is located at the center portion of each side portion of the sensor chip,
  wherein the circuit chip is mounted on a substrate so as to be electrically connected to the substrate by four or more substrate bonding wires, and four of the substrate bonding wires are arranged so that each of the four substrate bonding wires is located at each corner portion of the circuit chip,
  wherein the circuit chip has a rectangular shape that is larger than the sensor chip,
  wherein the sensor chip is mounted on a chip-mount area disposed at a center portion of the circuit chip,
  wherein the circuit chip includes four or more circuit chip electrode terminals disposed outside of the chip-mount area, the four or more circuit chip electrode terminals for electrically connecting the circuit chip to the sensor chip,
  wherein the four or more circuit chip electrode terminals include two output terminals for outputting pulse-shaped carrier waves having opposite phases, one input terminal for receiving an acceleration signal, and a ground terminal,
  wherein the circuit chip includes a conversion circuit for converting the acceleration signal to a voltage signal.

3. The capacitance type semiconductor sensor device according to claim 2, characterized in that the adhesive film has an elasticity of 175 MPa or less.

4. The capacitance type semiconductor sensor device according to claim 2, wherein the substrate includes a plurality of electrode leads disposed on right and left side portions in connection with the substrate bonding wires of the circuit chip.

5. The capacitance type semiconductor sensor device according to claim 2, wherein the substrate is formed of a ceramic board.

6. The capacitance type semiconductor sensor device according to claim 1, characterized in that the adhesive film has an elasticity of 175 MPa or less.

7. The capacitance type semiconductor sensor device according to claim 1, wherein the substrate includes a plurality of electrode leads disposed on right and left side portions in connection with substrate bonding wires of the circuit chip.

8. The capacitance type semiconductor sensor device according to claim 1, wherein the substrate is formed of a ceramic board.

* * * * *